(12) United States Patent
Okamura

(10) Patent No.: US 8,283,753 B2
(45) Date of Patent: Oct. 9, 2012

(54) SEMICONDUCTOR DEVICE

(75) Inventor: Ryuichi Okamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 11/712,910

(22) Filed: Mar. 2, 2007

(65) Prior Publication Data

US 2007/0216027 A1 Sep. 20, 2007

(30) Foreign Application Priority Data

Mar. 15, 2006 (JP) ................................ 2006-071089

(51) Int. Cl.
*H01L 29/93* (2006.01)
(52) U.S. Cl. .................. 257/534; 257/535; 257/542
(58) Field of Classification Search .................. 257/737, 257/532, 534, 535, 542
See application file for complete search history.

(56) References Cited

U.S. PATENT DOCUMENTS

| | | | |
|---|---|---|---|
| 5,432,379 A * | 7/1995 | Eguchi et al. | 257/627 |
| 5,918,135 A * | 6/1999 | Lee et al. | 438/393 |
| 6,204,074 B1 * | 3/2001 | Bertolet et al. | 438/18 |
| 6,597,032 B1 * | 7/2003 | Lee | 257/303 |
| 7,067,869 B2 * | 6/2006 | Cheng et al. | 257/301 |
| 2002/0070423 A1 * | 6/2002 | Takafuji | 257/532 |
| 2004/0067643 A1 * | 4/2004 | Liu et al. | 438/687 |
| 2004/0253783 A1 * | 12/2004 | Egashira et al. | 438/232 |
| 2005/0082637 A1 * | 4/2005 | Mikawa et al. | 257/532 |
| 2005/0142737 A1 * | 6/2005 | Park | 438/253 |
| 2006/0197183 A1 * | 9/2006 | Yang et al. | 257/532 |

FOREIGN PATENT DOCUMENTS

| | | |
|---|---|---|
| JP | 02-304963 | 12/1990 |
| JP | 06-029471 | 2/1994 |
| JP | 08/186235 | 7/1996 |
| JP | 10-313095 | 11/1998 |
| JP | 2001-313372 | 11/2001 |
| JP | 2002-057291 | 2/2002 |
| JP | 2002-353328 | 12/2002 |
| JP | 2003-282719 | 10/2003 |
| JP | 2004-266005 | 9/2004 |

OTHER PUBLICATIONS

JP Office Action dated Mar. 13, 2012, Application No: 2006-071089, with English Translation.

* cited by examiner

*Primary Examiner* — Steven Loke
*Assistant Examiner* — Kimberly M Thomas
(74) *Attorney, Agent, or Firm* — Young & Thompson

(57) ABSTRACT

A semiconductor device, which exhibits an increased design flexibility for a capacitor element, and can be manufactured with simple method, is provided. A semiconductor device 100 includes: a silicon substrate 101; an interlayer film 103 provided on the silicon substrate 101; a multiple-layered interconnect embedded in the interlayer film 103; a flip-chip pad 111, provided so as to be opposite to an upper surface of an uppermost layer interconnect 105 in the multiple-layered interconnect and having a solder ball 113 for an external coupling mounted thereon; and a capacitance film 109 provided between said uppermost layer interconnect 105 and the flip-chip pad 111. Such semiconductor device 100 includes the flip-chip pad 111 composed of an uppermost layer interconnect 105, a capacitive film 109 and a capacitor element 110.

8 Claims, 16 Drawing Sheets

1 : UNDERLYING INSULATING INTERLAYER
2A : UNDERLYING INTERCONNECT LAYER
2B : UNDERLYING METALLIC LAYER
2a,9a : TiN LAYER
2b,4a,9b : AlCu LAYER
2c,4b,9c : TiN (UPPER SIDE)
／Ti (LOWER SIDE) LAYER

3A : DIELECTRIC MATERIAL LAYER
4 : OVERLYING METALLIC LAYER
6 : ANTI-REFLECTING COATING
7A,7B,7C,7D,11 : INTERCONNECT LINE
7a,7b,7c,7d,11a : VIA HOLE
9A,9B,9C : OVERLYING INTERCONNECT LAYER

1 : FIRST INSULATING INTERLAYER
2, 7, 9 : BARRIER METAL
3 : FIRST ALUMINUM INTERCONNECT
4 : ANTI-REFLECTING COATING
5 : SECOND INSULATING INTERLAYER
10 : SECOND ALUMINUM INTERCONNECT
41 : TiN LAYER
42 : SiON LAYER
81 : UPPER ELECTRODE
82 : CONTACT PLUG

SEMICONDUCTOR DEVICE

This application is based on Japanese patent application No. 2006-71,089, the content of which is incorporated hereinto by reference.

BACKGROUND

1. Technical Field

The present invention relates to a semiconductor device, and particularly relates to a semiconductor device having an electrode pad such as a flip-chip pad and the like and a capacitor element.

2. Related Art

Increased scales and increased integrations are progressed in semiconductor devices of recent years, and number of signal pads and number of power supply pads are increased. Further, under a circumstance of increased operating rate of devices, improvements in electrical characteristic of devices such as impedance matching and the like between a semiconductor device and mounting substrate or package substrate are more critical. A flip-chip mounting becomes a mainstream of measures for solving such problems. The flip-chip mounting is a packaging scheme, which can achieve arranging pads across the entire surface of the semiconductor device, or more specifically, arranging multiple pads. Further, the flip-chip mounting can provides an improved electrical characteristics of devices over the packaged substrate or package substrate.

FIG. 11 is a cross-sectional view, illustrating a configuration of a conventional flip-chip pad (also referred to as FCPAD). A flip-chip pad shown in FIG. 11 is formed according to the following procedure.

First of all, an interlayer film 203 and an uppermost layer interconnect 205 are formed on a semiconductor substrate 201 having semiconductor elements and interconnects formed therein, and a cover film 207 for protecting the semiconductor devices is formed thereon. Next, only a portion on the uppermost layer interconnect 205 of the cover film 207 coupling to the flip-chip pad 211 is selectively removed to provide a pad via 217 extending through the cover film 207.

Subsequently, the flip-chip pad 211 is selectively formed in a region for forming the pad via 217 and the vicinity thereof. A solder ball 213 is, in turn, selectively formed on the flip-chip pad 211. Finally, though it is not shown in FIG. 11, the terminals in the side of the packaged substrate or the package substrate are coupled to the solder ball 213 to complete the flip-chip package.

Meanwhile, increased scales, increased integrations and increased operating rates are progressed in semiconductor devices, and a defectives in circuit operations due to a noise in power/signal such as cross talk or the like become more serious issues than before. Countermeasures for the issues is a method for inhibiting a noise by forming a capacitor element on a semiconductor device, and adding a capacitance to other required portion in a power supply or the like. In addition, processes for forming a capacitor element includes a process utilizing a semiconductor substrate and a process utilizing an interconnect process, and in recent years, a metal-insulator-metal (MIM) capacitance is often manufactured via the process utilizing the interconnect process, which provides relatively higher degree of design flexibility and higher density of capacitances.

Typical conventional technologies concerning the capacitor element includes technologies described in Japanese Patent Laid-Open No. 10-313,095 (1998), Japanese Patent Laid-Open No. 2002-353,328, Japanese Patent Laid-Open No. 2004-266,005, Japanese Patent Laid-Open No. 2001-313,372, Japanese Patent Laid-Open No. 2002-57,291, and Japanese Patent Laid-Open No. 8-186235 (1996).

A technology for forming a capacitance under a pad is described in Japanese Patent Laid-Open No. 10-313,095. FIGS. 12A and 12B are diagrams, illustrating a configuration of a device disclosed in Japanese Patent Laid-Open No. 10-313,095.

In a structure of FIGS. 12A and 12B, a silicon oxide film 3 serving as a capacitive film is formed on a well 14 formed in a single crystalline silicon substrate 1, and a first polycrystalline silicon interconnect 4, which would be employed as a gate electrode in the ordinary case, is formed thereon to form a capacitor element. Further, a contact hole 7, a first (aluminum) metallic interconnect 8 and a second (aluminum) metallic interconnect 9 are formed on the first polycrystalline silicon interconnect 4, and an aluminum bonding 16 is provided thereon to form a capacitor element under a pad.

However, in the configuration shown in FIG. 12, no transistor or no interconnect can be formed on portions having capacitances formed thereon. Thus, recently, MIM capacitances formed via the interconnect process are often employed.

FIG. 13 is a diagram, illustrating a configuration of a MIM capacitance described in Japanese Patent Laid-Open No. 2002-353,328. A configuration shown in FIG. 13 involves that, in the process for forming an underlying interconnect layer 2A, an underlying metallic layer 2B formed in a multiple-layered film is also simultaneously patterned, and a dielectric material layer 3A is formed thereon. Further, an overlying metallic layer 4 is formed thereon, and is selectively patterned to form a capacitor element between the underlying metallic layer 2B and the overlying interconnect layer 4. Thereafter, via holes 7a to 7d and 11a which provide couplings between respective interconnects and between electrodes, interconnect lines 7A to 7D, and 11, and upper interconnect layer 9A to 9C are formed.

FIG. 14 is a diagram, illustrating a configuration of a MIM capacitance described in Japanese Patent Laid-Open No. 2004-266,005. In the configuration shown in FIG. 14, a first aluminum interconnect 3 and an anti-reflection film 4 are formed, and then a second insulating interlayer 5 is formed. Next, an ordinary contact plug 82 is opened to expose a surface of the first aluminum interconnect 3, and an upper electrode 81 of a capacitance is opened to expose a surface of the anti-reflection film 4.

Then, respective openings are filled with barrier metals 7 and metallic electrodes, and further a second aluminum interconnect 10 is formed thereon. This provides a coupling between the first aluminum interconnect 3 and the second aluminum interconnect 10 via the contact plug 82, and a capacitor element having a capacitive film composed of a titanium nitride (TiN) layer 41 and a silicon oxynitride (SiON) layer 42 of the anti-reflection film 4 is formed between the first aluminum interconnect 3 and the upper electrode 81.

Further, a technology for forming a MIM capacitance between metallic layers by employing a copper wiring process according to a damascene process is described in Japanese Patent Laid-Open No. 2001-313,372. It may be considered that such technology is an advanced version of the technology described in Japanese Patent Laid-Open No. 2004-266,005. While the technology described in Japanese Patent Laid-Open No. 2004-266,005 involves separate processes for forming the contact plug coupling the upper and the lower plates and for forming the overlying plate via a single damascene process, the technology described in Japanese Patent Laid-Open No. 2001-313,372 involves a single process for simultaneously forming the contact plugs and the overlying plate via a dual damascene process. Further, while the technology described in Japanese Patent Laid-Open No. 2004-266,005 includes the upper plate coupled to an interconnect of the overlying layer, the technology described in Japanese Patent Laid-Open No. 2001-313,372 includes the upper plate coupled to the underlying interconnect.

A technology for forming a rerouting above a coupling pad, and then forming a capacitor element therebetween is described in Japanese Patent Laid-Open No. 2002-57,291.

A technology for forming a memory cell transistor and a memory capacitor on different substrates, and then bonding these substrates to form a dynamic random access memory (DRAM), is described in Japanese Patent Laid-Open No. 8-186235. In a circuit structure of such DRAM, one of terminals of a memory capacitor is coupled to a memory cell transistor, and the other is coupled to a ground.

SUMMARY OF THE INVENTION

However, there are rooms of following improvements in each of the technologies described in the above-listed related art documents.

First of all, in the technology described in Japanese Patent Laid-Open No. 10-313,095, since the capacitance is formed under the pad, no transistor or no interconnect can be formed on portions where the capacitance is to be formed. Further, the capacitance is formed on the silicon substrate, and therefore an increase in the capacity leads to an increase in the chip area. Further, with the tendency of providing an increased number of layers of the interconnects in recent years, a direct coupling of the capacitor element formed in the base process with the pad disposed immediately above thereof causes a decrease in degree of flexibility for designing the interconnects, and thus is not realistic.

Further, in the technology described in Japanese Patent Laid-Open No. 2002-353,328, another electrode layer is formed between the interconnect layers to serve as the upper electrode, and thus this requires complex structure and manufacturing condition, and also requires an increased number of operations.

Further, in the technology described in Japanese Patent Laid-Open No. 2002-353,328, the underlying interconnect is employed for the lower electrode of the capacitance. Further, in the technology described in Japanese Patent Laid-Open No. 2004-266,005, the overlying interconnect and the contact plug are employed for the upper electrode of the capacitance, and the underlying interconnect is employed for the lower electrode. In these structures, no interconnect can be extended through such portions, leading to a decrease in degree of flexibility for designing. Further, an increase in the capacity leads to an increase of ratio of area of the capacitances occupying the area of the interconnect, and a routing-ability and an accommodation of an interconnect is further deteriorated, so that chip area and number of the interconnects are increased.

In the technology described in Japanese Patent Laid-Open No. 2004-266,005, since the MIM capacitance is achieved without forming another layer between the interconnect layers by forming the upper electrode to be coplanar with the contact plug as described above in reference to FIG. 14, the structure can be more simplified, as compared with the configuration of Japanese Patent Laid-Open No. 2002-353,328 (FIG. 13). However, since the upper and lower interconnect layers are employed for the electrodes of the capacitance in the configuration shown in FIG. 14, limitations to the interconnect design are enhanced, and an increase in the capacitance leads to an increased chip size and/or an increased number of the interconnects.

Further, the technology described in Japanese Patent Laid-Open No. 2001-313,372 involves a problem that is similar as in the technology described in Japanese Patent Laid-Open No. 2004-266,005, since the upper plate and the lower plate are formed by adding a plate layer in the interconnect or employing an interconnect itself. Further, when the lower plate is employed as a coupling pad, an additional overlying plate layer is formed on the coupling pad, and thus additional operations for forming an electrically conducting layer are required.

In the technology described in Japanese Patent Laid-Open No. 2002-57,291, the capacitor element is formed above the electrode pad that is provided on a passivating film deposited on the insulating interlayer, and the dielectric material constituting the capacitor element is provided above the electrode pad, and further, another electrically conducting film is provided thereon. Thus, addition of the layer of the electrically conducting film composing the capacitor element leads to a complicated manufacturing process in the technology described in Japanese Patent Laid-Open No. 2002-57,291.

Further, in the technology described in Japanese Patent Laid-Open No. 8-186235, a memory capacitor segment and a transistor segment are separately manufactured, and the both segments are bonded via a bump therebetween, and therefore an alignment of the both segments for bonding is complicated. Further, there may be a concern of causing a misalignment between the substrates, which leads to a reduced manufacturing yield.

According to one aspect of the present invention, there is provided a semiconductor device, comprising: a semiconductor substrate; an insulating interlayer provided on the semiconductor substrate; a multiple-layered interconnect embedded in the insulating interlayer; an electrode pad, provided so as to be opposite to an upper surface of an uppermost layer interconnect in the multiple-layered interconnect and having a bump electrode for an external coupling mounted thereon; and a capacitance insulating film provided between the uppermost layer interconnect and the electrode pad, wherein the semiconductor device includes a capacitor element, which is composed of the uppermost layer interconnect, the capacitance insulating film and the electrode pad.

The conventional flip-chip pad 211 described above in reference to FIG. 11 in the description of the related art technologies is employed for mounting a solder ball for the flip-chip coupling. Therefore, it is inevitable that the flip-chip pad 211 is electrically coupled to the uppermost layer interconnect 205. It is also inevitable that the conventional flip-chip pad 211 has no function as a capacitor element.

On the contrary, in the semiconductor device of the present invention, a capacitance is formed between the uppermost layer interconnect and the electrode pad. Having such configuration, a capacitance can be formed between essential components in the semiconductor device, without a need for additionally having a new electrically conducting layer for forming a capacitance. Thus, a complication in the manufacturing process by providing a capacitor element can be avoided. Further, since a capacitance can be formed in a space area above the uppermost layer interconnect, the space area can be effectively utilized to provide a capacitor element while ensuring a certain degree of flexibility in the device design, and further an increased capacity thereof can be easily facilitated. Further, since the uppermost layer interconnect functioning as the lower electrode of the capacitor element can be utilized as a power supply line in the present invention, a stable operation of the power supply in the elements of the device can be achieved.

Here, the electrode pad that constitutes the capacitor element may or may not include a bump electrode mounted thereon, provided that the pad is configured to have a bump electrode for providing an external coupling mounted thereon.

Since the device according to the present invention includes the capacitor element composed of the uppermost layer interconnect, the capacitance insulating film and the electrode pad as described above, the region above the uppermost layer interconnect can be effectively utilized to provide the capacitor element, while inhibiting a complication in the process for manufacturing the semiconductor devices.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be repeated.

First Embodiment

Figure 1:
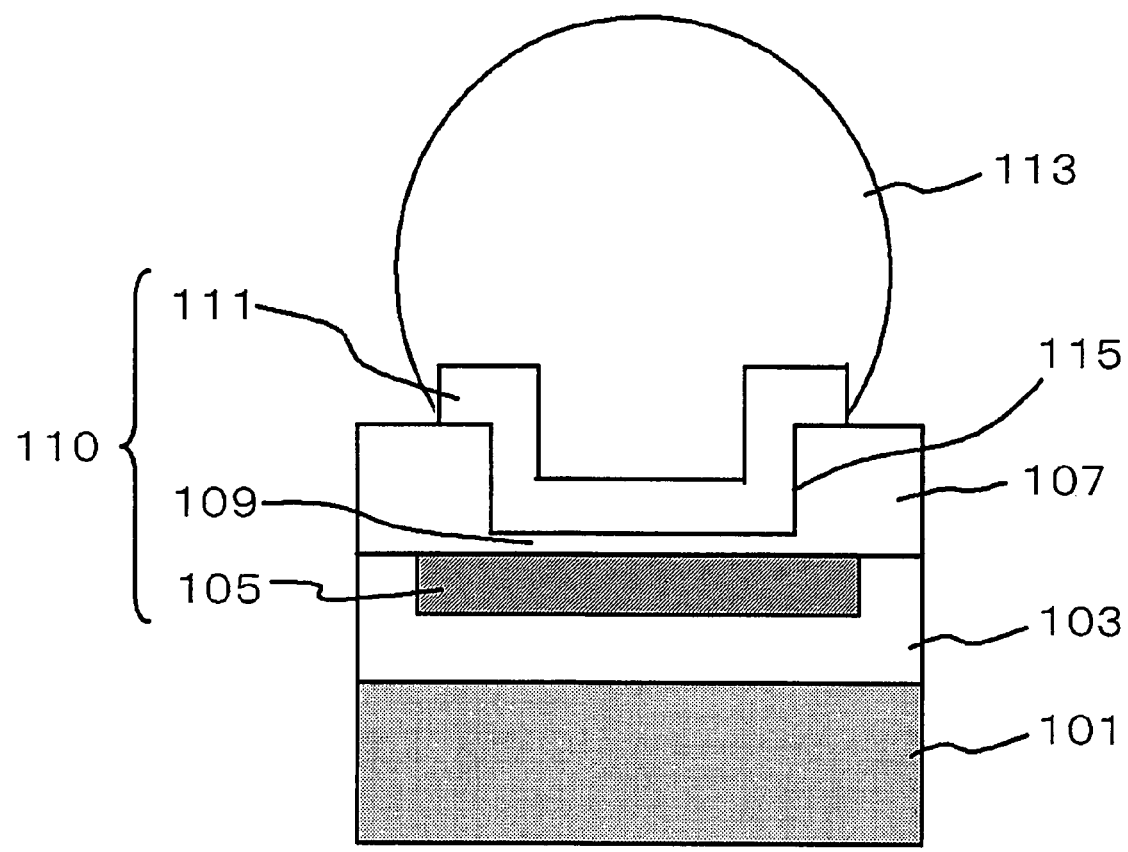
FIG. 1 is a cross-sectional view, illustrating a configuration of a semiconductor device in an embodiment.

FIG. 1 is a cross-sectional view, illustrating a configuration of a semiconductor device of the present embodiment.

A semiconductor device 100 shown in FIG. 1 includes: a semiconductor substrate (silicon substrate 101); an insulating interlayer (interlayer film 103) provided on the silicon substrate 101; a multiple-layered interconnect embedded in the interlayer film 103; a electrode pad (flip-chip pad 111), provided so as to be opposite to an upper surface of an uppermost layer interconnect 105 in the multiple-layered interconnect and having a bump electrode (solder ball 113) for an external coupling mounted thereon; and a capacitance insulating film (capacitance film 109) provided between the uppermost layer interconnect 105 and the flip-chip pad 111. In the semiconductor device 100, the solder ball 113 is joined to the flip-chip pad 111.

The semiconductor device 100 includes a capacitor element 110, which is composed of the uppermost layer interconnect 105, the capacitive film 109 and the flip-chip pad 111, and a capacitance is formed between the uppermost layer interconnect 105 and the flip-chip pad 111.

The semiconductor device 100 includes a first insulating film (cover film 107) covering an upper portion of the interlayer film 103, and is provided with a concave portion (aperture region 115) in a cover film 107 in a region facing the upper surface of the uppermost layer interconnect 105.

The thickness of the cover film 107 is partially reduced in the region for forming the aperture region 115, and the cover film 107 in the region having the reduced thickness constitutes the capacitive film 109. The capacitive film 109 formed between the uppermost layer interconnect 105 and the flip-chip pad 111 is formed by etching the cover film 107, and the capacitive film 109 is formed selectively in the region for forming capacitance between the uppermost layer interconnect 105 and the flip-chip pad 111.

The cover film 107 is formed with, for example, a material, which is different from that for the interlayer film 103. In the present embodiment, the interlayer film 103 is an insulating film containing silicon, and the cover film 107 and the capacitive film 109 are organic resin films such as a polyimide film and the like. The cover film 107 functions as a passivating film, and the region thereof having reduced thickness also functions as the capacitive film 109. In the semiconductor device 100, the passivating film and the capacitive film 109 are formed to be integral and continuous.

The flip-chip pad 111 has a configuration of an electrode pad that provides a flip-connection of the silicon substrate 101 on other substrate. The flip-chip pad 111 is provided above the cover film 107, and constitutes an upper electrode of the capacitor element 110. The flip-chip pad 111 is provided so as to cover an interior wall of the aperture region 115 and to extend to outside of the aperture region 115. Further, no rerouting layer is included in the upper portion of the flip-chip pad 111.

The flip-chip pad 111 is composed of an electrically conducting film containing a metal such as, for example, nickel (Ni), copper (Cu), molybdenum (Mo), titanium (Ti), titanium nitride (TiN), titanium tungsten (TiW), tantalum (Ta), tantalum nitride (TaN) and the like, or composed of multiple-layered film of these films. The material of the flip-chip pad 111 may be a different from the material of the uppermost layer interconnect 105. This provides an increased selectivity of a material exhibiting better adhesiveness with the solder ball 113 for the flip-chip pad 111.

A material of the solder ball 113 may be, for example, an alloy of lead (Pb) and tin (Sn), an alloy of silver (Ag) and Sn, or the like. While configurations of employing the solder ball 113 for the bump electrode mounted on the flip-chip pad 111 are illustrated in the present embodiment and the following embodiments, the material of the bump electrode is not limited to solder.

The uppermost layer interconnect 105 that constitutes the capacitor element 110 may be, for example, a power supply interconnect (VDD) or a ground interconnect (GND). Further, the uppermost layer interconnect 105 that constitute the capacitor element 110 may be a signal interconnect.

The semiconductor device shown in FIG. 1 may be formed via, for example, the following process.

First of all, the interlayer film 103 is formed on the silicon substrate 101 having predetermined semiconductor elements, interconnects and circuits formed thereon, and then the uppermost layer interconnect 105 is formed in such interlayer film. The uppermost layer interconnect 105 may be, for example, a multiple-layered film of a layer composed of aluminum (Al), Cu, and an alloy thereof, and a layer composed of Ti, TiN, TiW, Ta, TaN or the like.

The cover film 107 for protecting the semiconductor element is formed on the uppermost layer interconnect 105. Subsequently, a mask (not shown) having a region for forming the capacitance above the uppermost layer interconnect 105 serving as an opening portion is formed on the upper surface of the cover film 107. The cover film 107 include a reduced thickness in the region exposed from the opening portion, so that a thinner region functioning as the capacitive film 109 is formed, the opening region 115 having a bottom surface of the upper surface of the thinner region is formed.

Next, the flip-chip pad 111 is formed on the opening region 115. In this case, the flip-chip pad 111 is formed to extend from an interior wall of the opening region 115 over an exterior of the opening region 115.

Then, the solder ball 113 for providing a coupling to the packaged substrate or package substrate is formed on the flip-chip pad 111.

The semiconductor device shown in FIG. 1 is obtained according to the above-described procedure. In such procedure, the capacitive film 109 is formed between the flip-chip pad 111 and the uppermost layer interconnect 105 to form the capacitor element 110.

Figure 11:
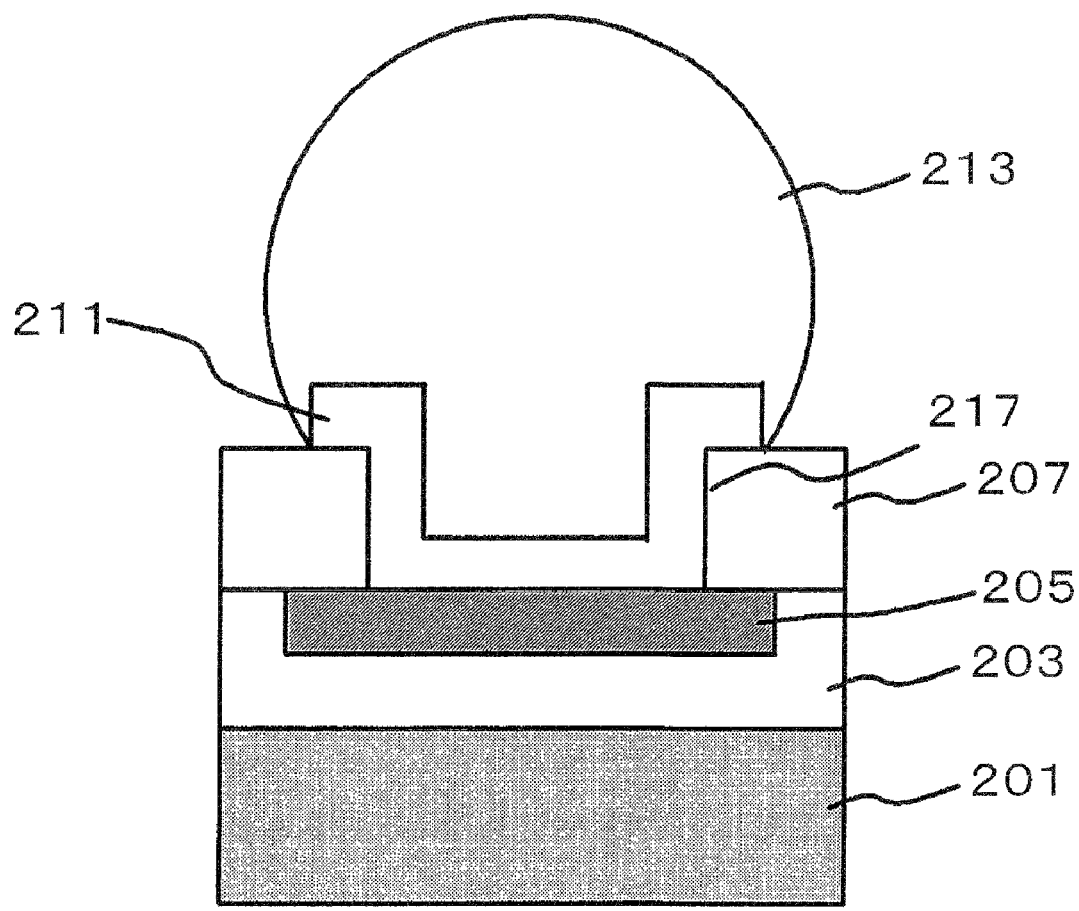
FIG. 11 is a cross-sectional view, illustrating a configuration of a conventional semiconductor device.
Figure 12A:
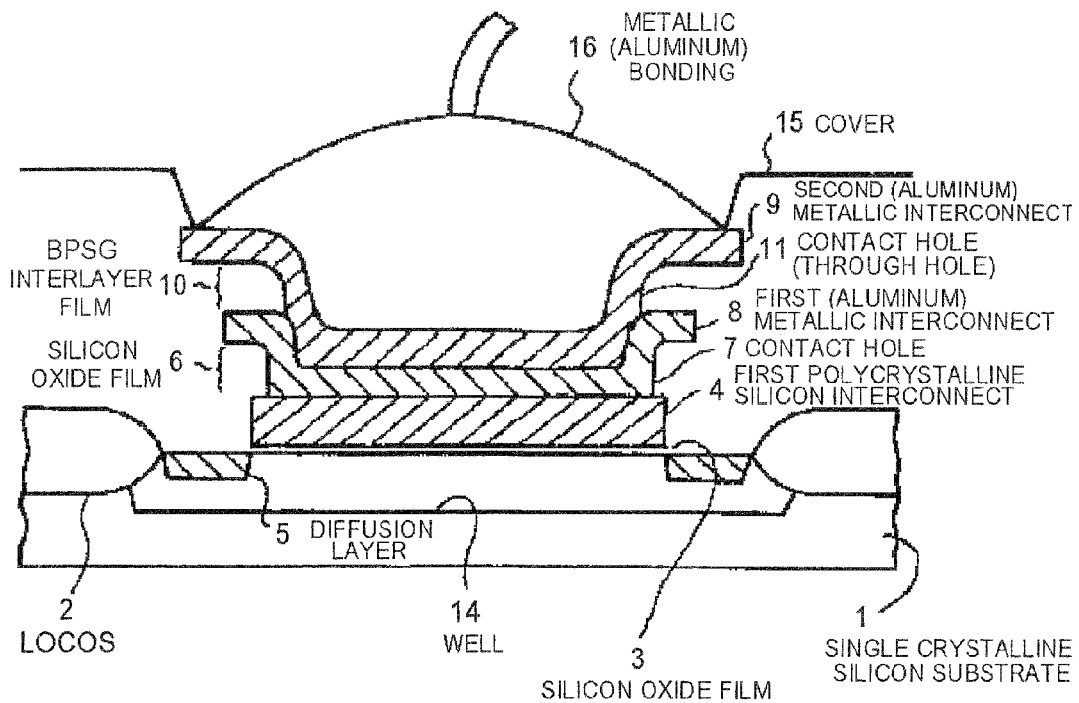
FIGS. 12A and 12B are diagrams, illustrating a configuration of a conventional semiconductor device.
Figure 12B:
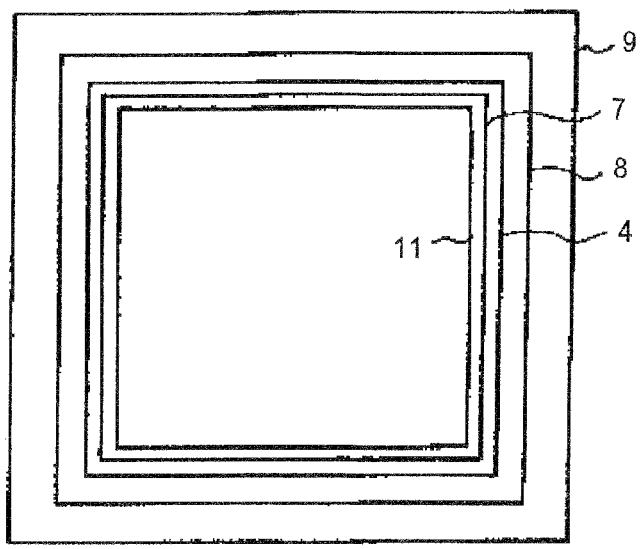
Figure 13:
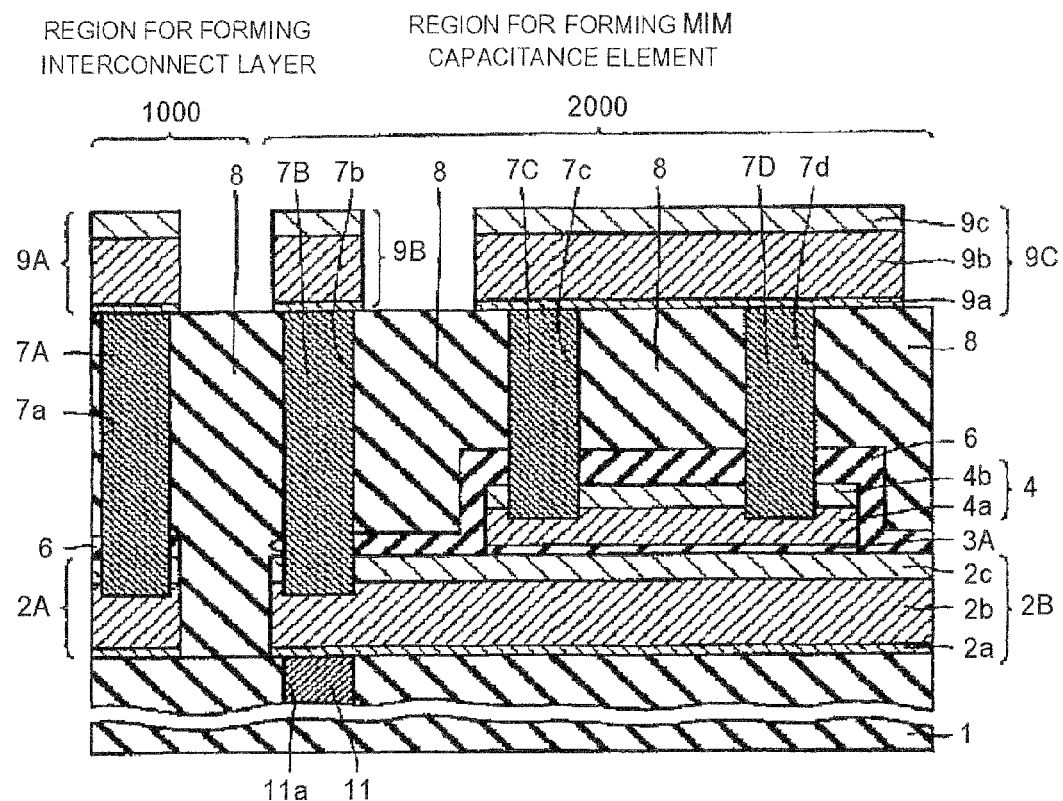
FIG. 13 is a cross-sectional view, illustrating a configuration of a conventional semiconductor device.
Figure 14:
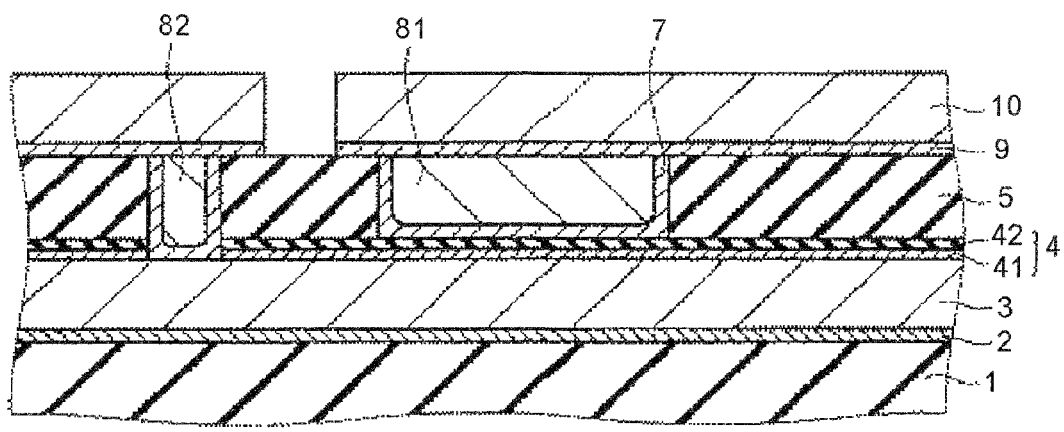
FIG. 14 is a cross-sectional view, illustrating a configuration of a conventional semiconductor device.

Further, since the thickness of the cover film 107 is partially reduced to serve as the capacitive film 109 in the present embodiment, the device of the present embodiment can easily be obtained by simply adjusting a suitable opening condition of the cover film of the conventional semiconductor device described above in reference to FIG. 11.

In the present embodiment, the flip-chip pad 111 provided above the silicon substrate 101 is employed, so that the capacitor element 110 can be formed with a minimum number of operations. In this case, the capacitance can be formed by simply changing a condition for etching the cover film 107 without a need for adding new electrically conducting layer for providing a capacitor element. Thus, a simplification of the manufacturing process can be achieved.

Figure 15:
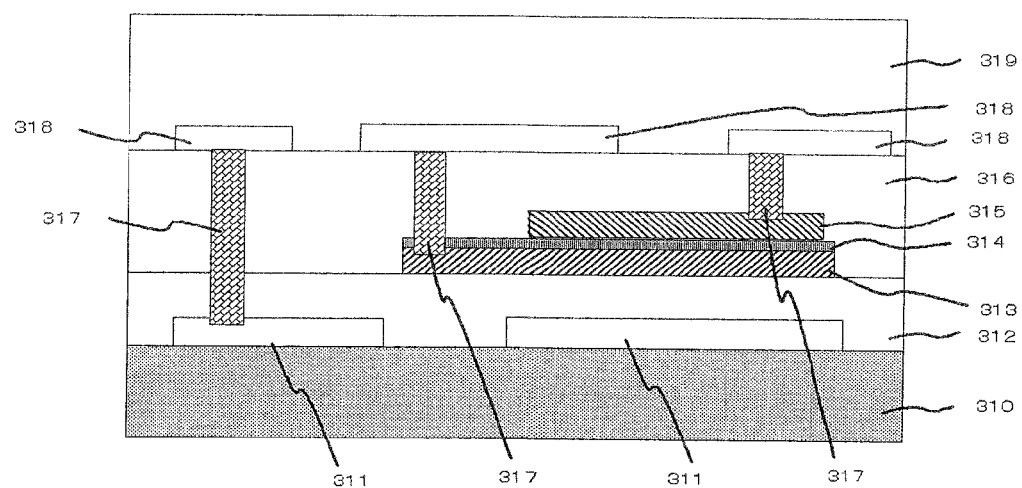
FIG. 15 is a cross-sectional view, illustrating a configuration of a conventional semiconductor device.

FIG. 15, is a cross-sectional view, illustrating an exemplary implementation of a configuration of a semiconductor device having dedicated capacitance electrodes between the interconnect layers. The structure illustrated in FIG. 15 is formed according to the following procedure. Underlying interconnects 311 are formed on a semiconductor substrate 310. Next, an interlayer film 312 is formed thereon. Further, a capacitance underlying electrode 313 and a capacitive film 314 are formed thereon, and are patterned. A capacitance upper electrode 315 is selectively formed thereon, and an interlayer film 316 is formed on the entire surface thereof. Next, a required portion is opened to form a contact plug 317 for providing a coupling to an upper electrode, and an overlying interconnect 318 is formed thereon and the formed interconnect is patterned and an interlayer film 319 is formed on the entire surface thereof.

Since the dedicated capacitance electrodes are formed without utilizing an interconnect for an electrode in the exemplary implementation shown in FIG. 15, limitation to the design for the interconnects is reduced, an increase in the chip size and an increase in number of the interconnect layers due to an increase in the capacitance can be relatively reduced, as compared with the technologies disclosed in the above-described Japanese Patent Laid-Open No. 2002-353,328 and Japanese Patent Laid-Open No. 2004-266,005. However, since the upper and lower capacitance electrodes and dedicated layers are formed between the interconnect layers, the structure and the manufacturing condition is complicated and number of required operations is also increased.

On the contrary, according to the present embodiment, simplification in the device configuration and the manufacturing process can be achieved, as compared with the configuration for forming the dedicated capacitance electrodes between the interconnect layers.

Further, since a space area in the uppermost layer interconnect can be effectively utilized as a capacitance in the present embodiment, a design of the capacity-arranging region may be provided after designs for all elements including the uppermost layer interconnect is finished, and therefore design limitation and the like due to locations for disposing the capacitances is not needed to be considered, which provides no inhibition to the degree of flexibility in designing the interconnects and/or the elements.

Figure 16:
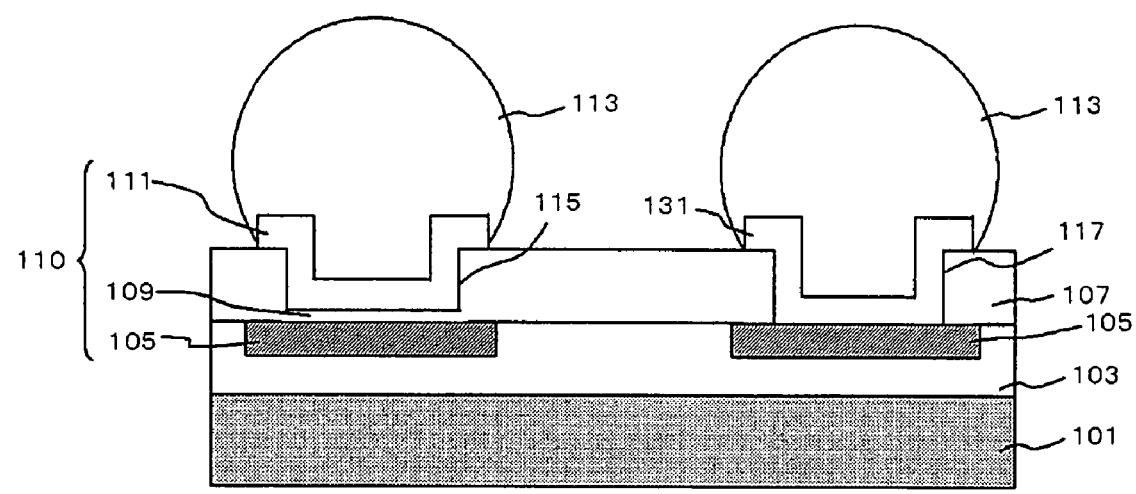
FIG. 16 is a cross-sectional view, illustrating a configuration of a semiconductor device in an embodiment.

FIG. 16 is a diagram, illustrating an exemplary implementation further including a flip-chip pad for providing flip-bonding of the semiconductor device 100 shown in FIG. 1. In the configuration shown in FIG. 16, the flip-chip pad 111 is provided in a certain region on the uppermost layer interconnect 105, and the flip-chip pad 131 is provided in other region. The flip-chip pad 131 is electrically coupled to the uppermost layer interconnect 105. The flip-chip pad 131 is an electrode pad, which is capable of electrically coupling an electrode provided in other substrate to the uppermost layer interconnect 105 when the silicon substrate 101 is flip-bonded to other substrate.

In this case, since the flip-chip pad 111 that constitutes the capacitor element 110 and the flip-chip pad 131 can be simultaneously formed in the same operation, a complication in the manufacturing process caused by providing the capacitor element 110 can be reduced.

Further, the flip-chip pads 111 are ordinarily disposed above the silicon substrate 101 to form a grid-like pattern or an array-like pattern with equal intervals or in conformance with a predetermined arrangement rule. The flip-chip pads 111 are disposed in a space area, where no flip-chip pad 131 for providing an ordinary coupling is disposed, without a need for changing the rule for arranging the flip-chip pads 131. Thus, the presence of the flip-chip pads 111 does not adversely affect the arrangement of the flip-chip pads 131 for providing an ordinary coupling in the periphery thereof. In the present embodiment, the space area is effectively utilized to provide the high capacity capacitor element 110, and the simplification in the manufacturing process, the ensured design flexibility and the facilitated increase in the capacitance can be achieved.

In addition to above, while the configuration of having just one flip-chip pad 131 and just one flip-chip pad 111 is illustrated in FIG. 16, a predetermined number of pads can be provided above the silicon substrate 101. Since the number of the flip-chip pad 111 mounted thereon can be freely determined within a permissible range, a rise and fall in the capacitance value can be facilitated. Further, since the flip-chip pad 111 is manufactured in the last operation in the diffusion procedure, a change and/or a correction in the capacitance value can be easily achieved, when the change and/or the correction is required after finishing the design.

Further, while the configuration, in which a two-dimensional geometry of the flip-chip pad 111 that constitutes the capacitor element 110 is identical to a two-dimensional geometry of the flip-chip pad 131 that couples to the pad of the packaging substrate, is illustrated in FIG. 16, these two-dimensional geometries may be different as discussed later in description of tenth embodiment.

Further, the capacitor element that is easily providing an increased capacitance can be formed with a simple process without disturbing a design flexibility in the present embodiment, by providing the flip-chip pad 111 having the capacitance therewith. Further, a rise and fall or a change in the capacitance value are also facilitated. Further, the flip-chip pad 111 that constitutes the capacitor element 110 also configured to function as a signal input pad or a power supply pad.

Further, since the uppermost layer interconnect 105 can be utilized as a power line in the present embodiment, immediate power supply can be achieved and stable electrical potential can be ensured. Thus, a generation of a defect in the circuit operation due to a noise can be inhibited by employing the capacitor element 110.

Further, in the semiconductor device 100, the flip-chip pad 111 is configured to cover an interior wall of the aperture region 115 and to extend to the cover film 107 outside of the aperture region 115. Thus, the solder ball 113 can be more surely mounted within a region for forming the flip-chip pad 111 as compared with the configurations described in the above-listed documents, when the solder ball 113 is joined to the flip-chip pad 111. Thus, contaminations and the like due to a diffusion of a metal in the solder ball 113 by the solder ball 113 contacting with the cover film 107 can be more effectively inhibited.

Further, since the present embodiment utilizes the flip-chip pad 111 as an upper electrode, in contrast to the technology described in Japanese Patent Laid-Open No. 8-186235, which includes one of the terminals of the memory capacitor that is necessarily coupled to the ground, the flip-chip pad 111 can be coupled to a desired potential, in addition to the ground.

While the exemplary implementation of employing the organic resin film such as a polyimide film or the like for the cover film 107 and the capacitive film 109 is described in the present embodiment, films available in the configuration may include insulating films containing silicon and the like, such as silicon oxide film, silicon nitride film, silicon oxynitride film, silicon carbide film, silicon carbonitride film and the like, and a single film of such films or a multiple-layered film of two or more of the above-described films may also be employed.

In the following embodiments, descriptions will be made focusing on features different from first embodiment.

Second Embodiment

Figure 2:
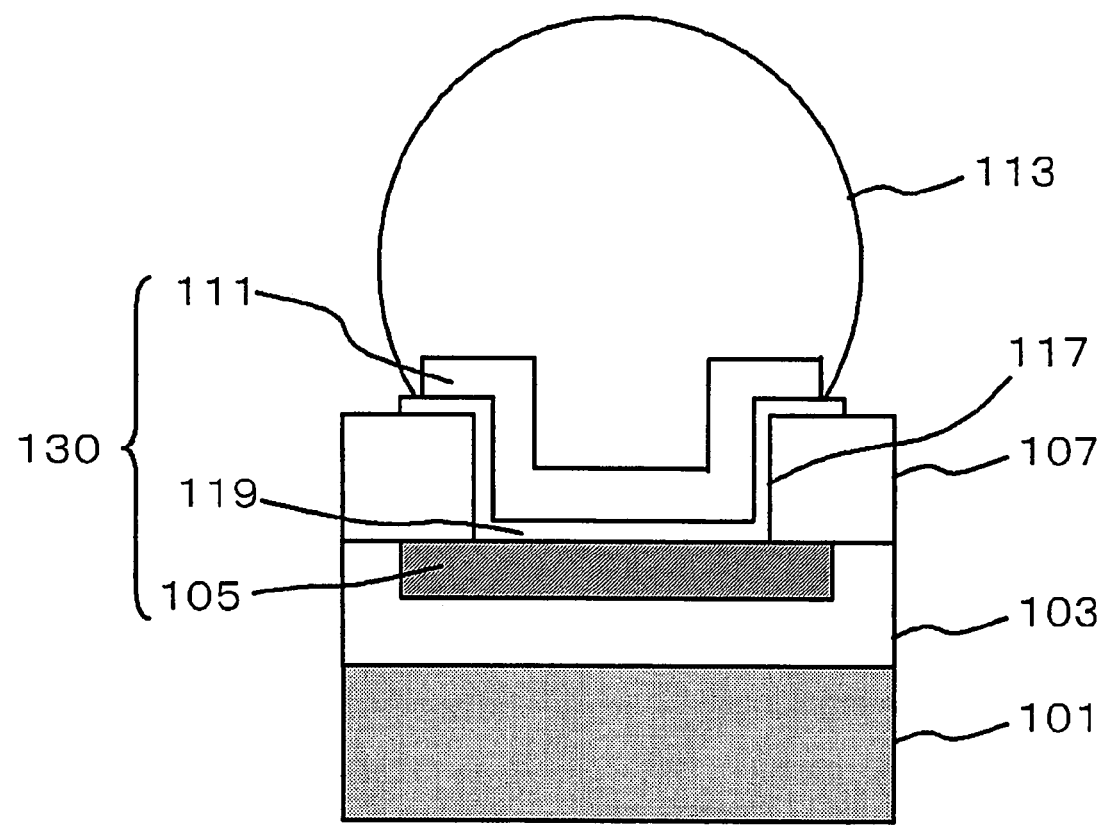
FIG. 2 is a cross-sectional view, illustrating a configuration of a semiconductor device in an embodiment.

FIG. 2 is a cross-sectional view, illustrating a configuration of a semiconductor device of the present embodiment.

Fundamental configuration of a semiconductor device 120 shown in FIG. 2 is similar to that of the semiconductor device 100 described in first embodiment (FIG. 1), except that different insulating films are employed for the cover film 107 and the capacitive film 119 of the capacitor element 130, respectively.

Further, the concave portion formed in the cover film 107 corresponds to a through hole (pad via 117) that extends through the cover film 107 in the semiconductor device 120. The semiconductor device 120 includes a second insulating film (capacitive film 119) covering an interior wall of such through hole, and the flip-chip pad 111 is provided on the capacitive film 119.

The pad via 117 is a via hole provided in cover film 107 in a region where capacitor element 130 is to be formed.

In the present embodiment, the cover film 107 may be composed of a passivating film formed of an organic resin film such as, for example, polyimide film and the like.

Further, the capacitive film 119 is composed of, for example, a material that is different from the material of the cover film 107. In the present embodiment, the capacitive film 119 may be composed of, for example, a high dielectric constant film.

Here, the high dielectric constant film is a film exhibiting higher specific dielectric constant than silicon oxide, and so-called "high-k film" may be employed. The high dielectric constant film may be composed of a material exhibiting a specific dielectric constant of 6 or higher. More specifically, the high dielectric constant film may be constituted of a material containing one or more metallic element(s) selected from a group consisting of hafnium (Hf), tantalum (Ta), zirconium (Zr), titanium (Ti), tungsten (W), rhenium (Re), terbium (Tb) and aluminum (Al), and a film an alloy film, an oxide film, a silicate film and a carbonized film or the like containing the above metallic elements may also be employed. One of these films may be employed alone, or a multiple-layered film composed of a combination of two or more of these films may also be employed.

The semiconductor device shown in FIG. 2 is formed according to the following procedure. The cover film 107 on the uppermost layer interconnect 105 is formed by employing the process described in first embodiment. Thereafter, in a region for forming a capacitor element 130, a portion of the cover film 107 disposed on the uppermost layer interconnect 105 is selectively removed to create an opening. In the present embodiment, the pad via 117 extending through the cover film 107 is formed during the creation of such opening, by the process for forming the pad via 217 of the semiconductor device as described above in reference to FIG. 11, to expose an upper surface of the uppermost layer interconnect 105.

Next, an insulating film for composing the capacitive film 119 is formed on the entire upper surface of the cover film 107, and then the insulating film is patterned, so that portions of the insulating film are selectively remained in regions except the capacitor-forming region and a vicinity thereof. This provides forming the capacitive film 119 that covers a bottom surface of the pad via 117.

Thereafter, the processes after forming the flip-chip pad 111 are conducted by employing the processes described above in first embodiment.

As described above, the present embodiment involves that, after creating the opening in the cover film 107, the capacitive film 119 is formed with the process that is different from the process for the cover film 107, and the capacitive film 119 is selectively formed in portions for forming capacitances between the uppermost layer interconnect 105 and the flip-chip pad 111 and the vicinity thereof.

Since the capacitance is formed between the flip-chip pad 111 and the uppermost layer interconnect 105 in the present embodiment, advantageous effects obtainable in first embodiment can also be obtained.

Further, since the material of the capacitive film 119 can be arbitrarily selected independently from selecting the material for the cover film 107 in the present embodiment, the capacitance value of the capacitor element can be established to a desired value with a higher degree of flexibility. Further, a high-k capacitive film and the like is employed for the capacitive film 119, so that higher capacity of the capacitor element 130 can be easily achieved.

Further, also in the present embodiment, the flip-chip pad 111 is configured to cover an interior wall of the pad via 117 and to extend on the cover film 107 the pad via 117. Further, in the present embodiment, the capacitive film 119 is configured to cover an interior wall of the pad via 117 and to extend on the cover film 107 the pad via 117. Thus, an inhibition of a contact of the solder ball 113 with the cover film 107 can be further ensured. Thus, contaminations or the like caused by a diffusion of metal in the solder ball 113 can further be effectively inhibited.

While the exemplary implementation of including the capacitive film 119 composed of a high dielectric constant film is described in the present embodiment, specific examples of films available for the capacitive film 119 includes silicon oxide film, silicon nitride film, silicon oxynitride film, silicon carbide film, silicon carbonitride film, polyimide film or the like, and a single film of such films or a stacked film of two or more of the above-described films may also be employed. Further, these films may also be employed in combination with the above-described high dielectric constant film.

Further, the films described above in first embodiment may additionally be employed for the cover film 107.

Among the following embodiments, third to eighth embodiments represent descriptions of exemplary implementations, in which a capacitive film in a capacitor element is a region of the cover film 107 having reduced thickness, as the capacitor element 110 described in first embodiment. Of course, in these embodiments, a capacitive film of a capacitor element may also be another insulating film provided on the cover film 107, as in second embodiment.

Third Embodiment

The configurations of the above-mentioned embodiment may alternatively be configured that the uppermost layer interconnect and the electrode pad, which constitute a capacitor element, are respectively coupled to different power supply potentials.

For example, when the uppermost layer interconnect 105 under the flip-chip pad 111 is a power supply interconnect (VDD) or a grounding interconnect (GND), the following procedure is conducted. When the uppermost layer interconnect 105 is a power supply interconnect, a pad 123 in the side of the substrate, which is coupled with the flip-chip pad 111 that constitutes the capacitance, is assigned to be for a ground, and when the uppermost layer interconnect 105 is a grounding interconnect, the pad 123 in the side of the substrate is assigned to be for a power supply. As described above, the uppermost layer interconnect 105 and the pad 123 in the side of the substrate, which is coupled with the flip-chip pad 111 that faces the uppermost layer interconnect 105, are coupled to different power supplies of different potentials, respectively.

Figure 3:
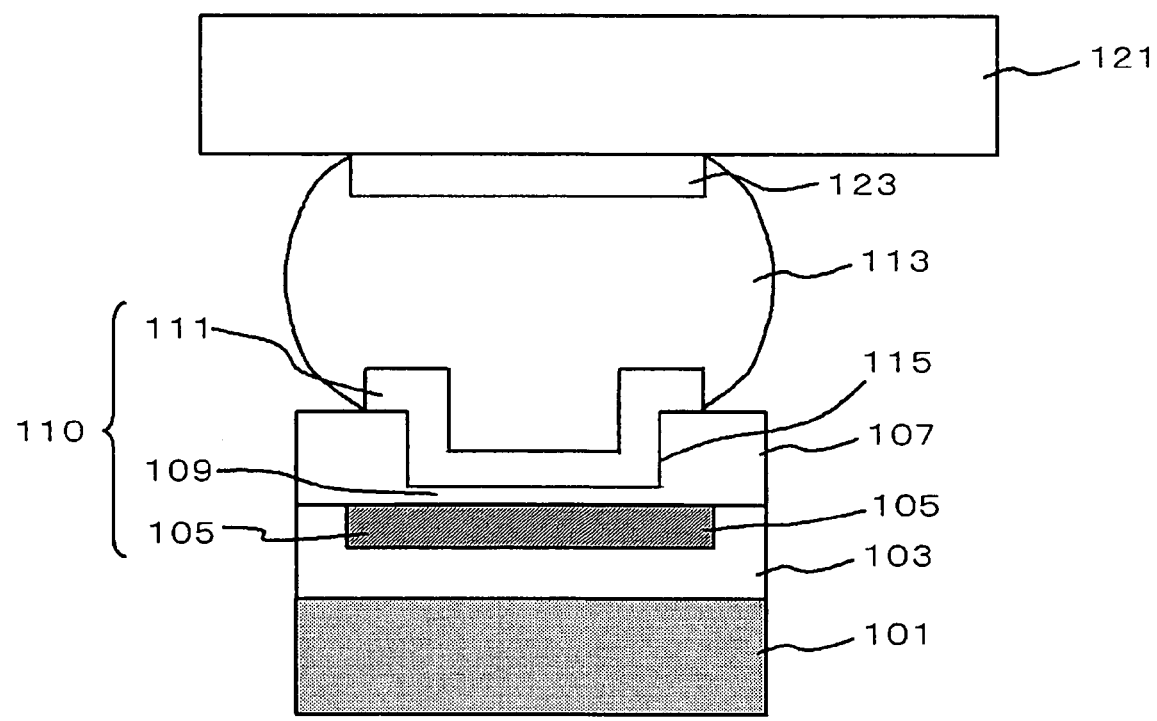
FIG. 3 is a cross-sectional view, illustrating a configuration of a semiconductor device in an embodiment.

FIG. 3 is a cross-sectional view, illustrating a configuration of a semiconductor device of the present embodiment. Fundamental configuration of the semiconductor device shown in FIG. 3 is similar to that of the semiconductor device 100 described in first embodiment (FIG. 1), except that the semiconductor device further includes a substrate 121 having a pad 123 in a side of the substrate, and the pad 123 in the side of the substrate is joined to solder ball 113.

The substrate 121 is a substrate, which is flip-bonded with the silicon substrate 101. The substrate 121 is, for example, a packaged substrate or a package substrate.

The flip-chip pad 111 may be coupled to an interconnect (not shown) provided in the substrate 121 through the pad 123 in the side of the substrate. For example, the flip-chip pad 111 may be coupled to a power supply interconnect or a grounding interconnect provided in the substrate 121. Further, the pad 123 in the side of the substrate may be a power supply interconnect (VDD) or a grounding interconnect (GND).

The structure shown in FIG. 3 is manufactured according to the following procedure.

The processes until forming the solder ball 113 on the silicon substrate 101 are conducted by employing the processes described above in first embodiment. The uppermost layer interconnect 105 is coupled to a first power supply potential. Besides, the substrate 121 provided with the pad 123 in the side of the substrate is prepared. In addition to above, the pad 123 in the side of the substrate is coupled to, for example, a second power supply potential that is different from the first power supply potential.

Next, the pad 123 in the side of the substrate provided on the substrate 121 is coupled to the solder ball 113. A heating temperature and a heating time at this time can be suitably determined according to the type of the material of the solder ball 113. For example, a heating is conducted at a temperature of around 200 to 350 degree C. for around several minutes to several tens minutes to melt the solder ball 113, thereby providing a coupling with the pad 123 in the side of the substrate.

In the present embodiment, the uppermost layer interconnect 105 is coupled to the first power supply potential, and the pad 123 in the side of the substrate coupled to flip-chip pad 111 is coupled to the second power supply potential that is different from the first power supply potential. Since the second power supply potential is not equivalent to the first power supply potential, capacitances between the uppermost layer interconnect 105 and the flip-chip pad 111 are formed in different potentials, a noise or the like caused by a drift in the power supply potential can be inhibited.

Fourth Embodiment

The configurations of the above-mentioned embodiment may alternatively be configured that a single uppermost layer interconnect is disposed under the entire flip-chip pad 111.

Figure 4A:
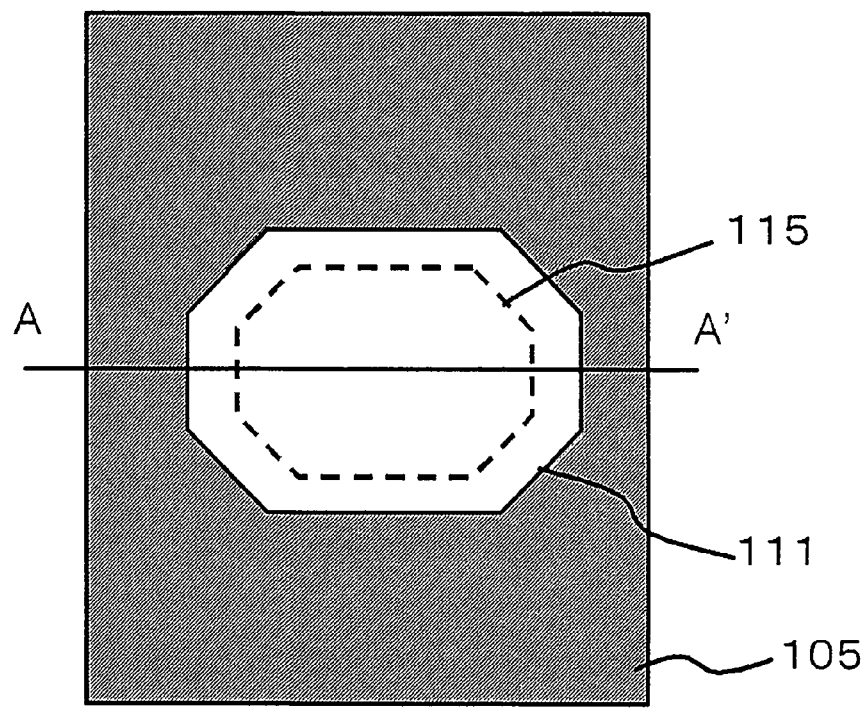
FIGS. 4A and 4B are diagrams, illustrating a configuration of a semiconductor device in an embodiment.
Figure 4B:
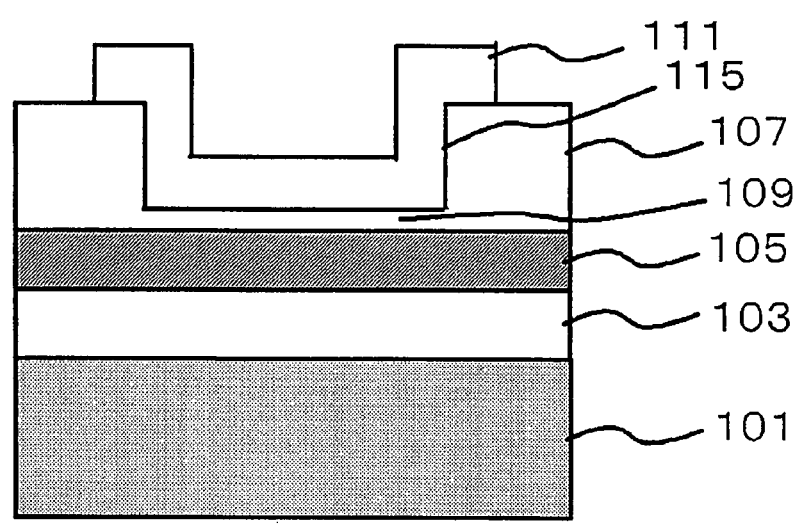

FIG. 4A and FIG. 4B are diagrams, illustrating a configuration of a semiconductor device of the present embodiment. FIG. 4A is a plan view, and FIG. 4B is a cross-sectional view along line A-A' of FIG. 4A.

Fundamental configuration of the semiconductor device of the present embodiment is similar to that of the semiconductor device 100 described in first embodiment (FIG. 1), except that the semiconductor device further includes a single uppermost layer interconnect 105 disposed on the entire region that faces to a lower surface of the flip-chip pad 111, as shown in FIG. 4A. This can provide a maximum dimension of the opening region 115 in the flip-chip pad 111 of any bottom surface area, and thus the configuration of the device is more suitable for increasing a capacitance.

Fifth Embodiment

The present embodiment is related to a configuration, in which the configuration of first embodiment additionally includes a plurality of uppermost layer interconnects provided under the flip-chip pad 111, and among the uppermost layer interconnects, the specified interconnects are selected to include capacitances thereon.

Figure 5A:
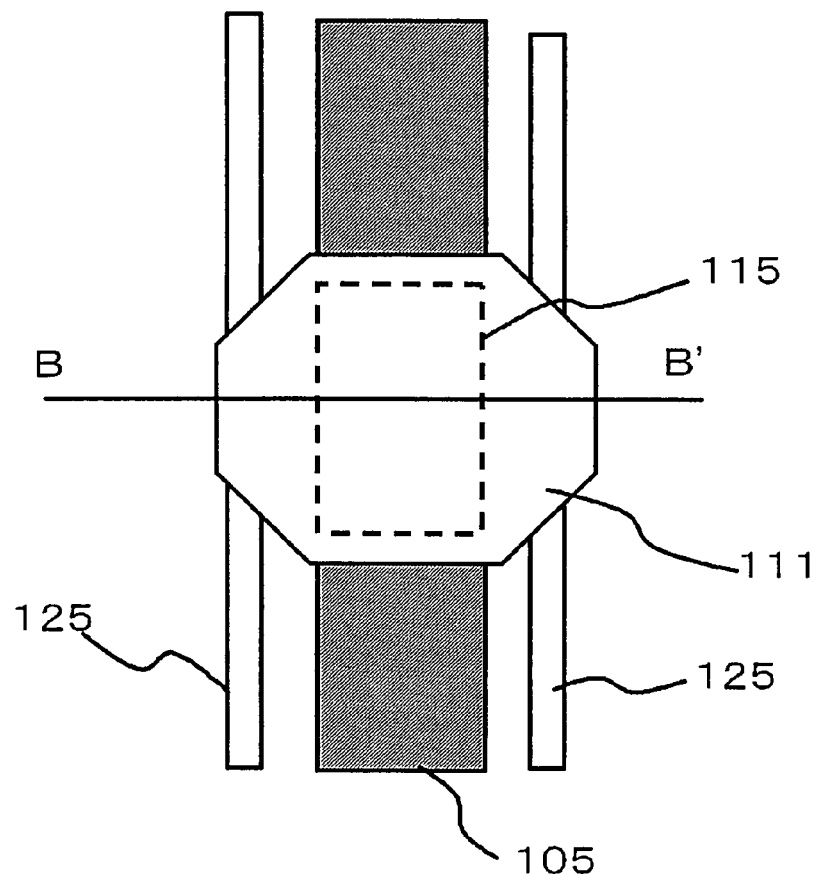
FIGS. 5A and 5B are diagrams, illustrating a configuration of a semiconductor device in an embodiment.
Figure 5B:
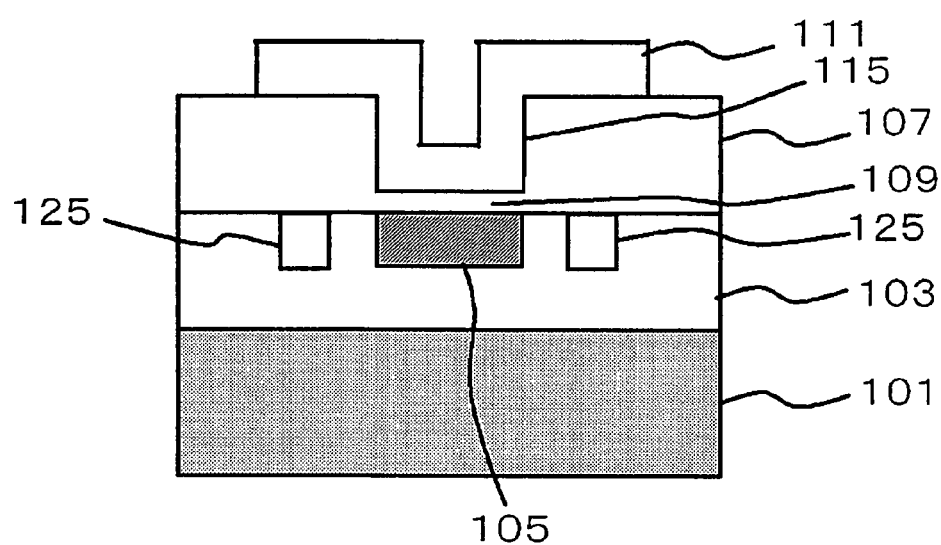

FIG. 5A and FIG. 5B are diagrams, illustrating a configuration of a semiconductor device of the present embodiment. FIG. 5A is a plan view, and FIG. 5B is a cross-sectional view along line B-B' of FIG. 5A.

Fundamental configuration of the semiconductor device of the present embodiment is similar to that of the semiconductor device 100 described in first embodiment (FIG. 1), except that the uppermost layer interconnect 105 and the uppermost layer interconnect 125 are provided in the same layer for the uppermost layer interconnects.

When the semiconductor device of the present embodiment is formed, first of all, the interlayer film 103 is formed on the silicon substrate 101 having a semiconductor element/interconnect and/or a circuit formed therein.

Next, the uppermost layer interconnect 105 employed for a power supply interconnect or a signal interconnect and having a relatively broader cross section and the uppermost layer interconnect 125 mainly employed for a signal interconnect and having a relatively narrower cross section are formed in the same process in the process for forming the uppermost layer interconnect to be in coplanar relationship. Then, the cover film 107 is formed.

Subsequently, the opening region 115 is selectively formed only in regions above the uppermost layer interconnect 105 to form a thinned region of the cover film 107. Such thinned region functions as the capacitive film 109. Then, the flip-chip pad 111 is formed on the capacitive film 109. Available process for forming respective layers and the configurations thereof may include the process and the configuration described in first embodiment.

In the present embodiment, among a plurality of uppermost layer interconnects disposed under the flip-chip pad 111, only the specified interconnects can be employed as the lower electrode of the capacitor element. In addition, this provides a further improved design flexibility for the layer underlying the flip-chip pad 111.

Sixth Embodiment

The present embodiment is related to a configuration, in which the uppermost layer interconnects of the flip-chip pad 111 in first embodiment are a plurality of power supply interconnects of different potentials, signal interconnects, or a combination thereof.

Figure 6A:
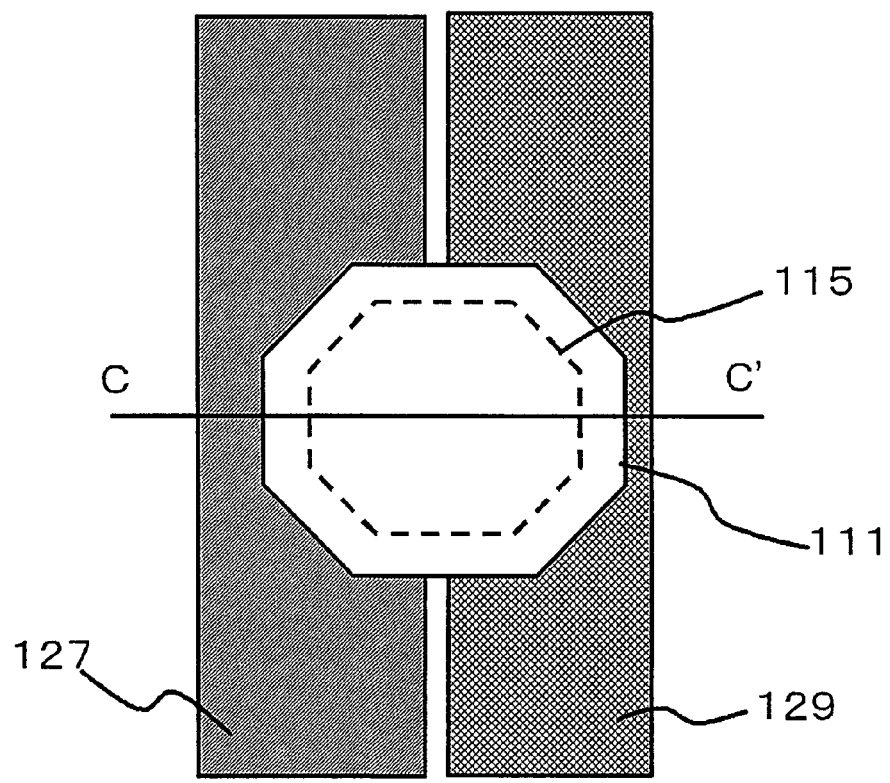
FIGS. 6A and 6B are diagrams, illustrating a configuration of a semiconductor device in an embodiment.
Figure 6B:
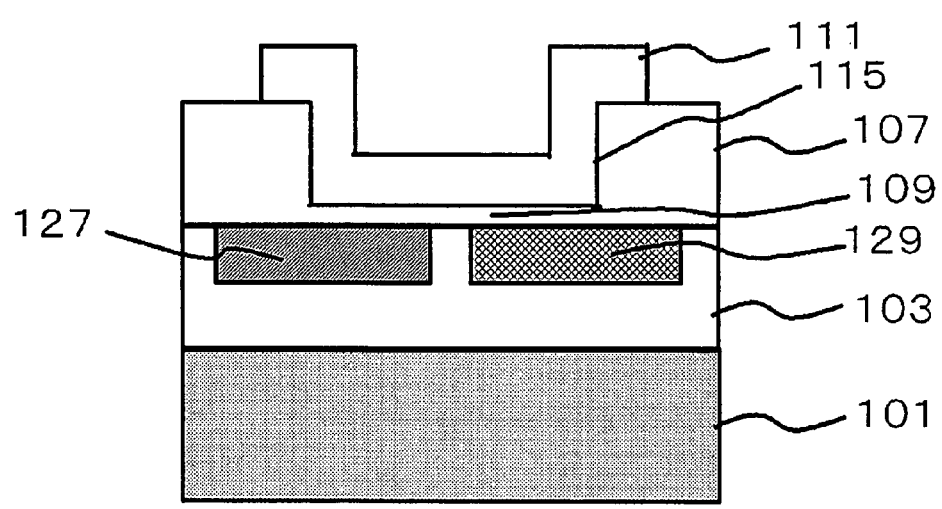

FIG. 6A and FIG. 6B are diagrams, illustrating a configuration of a semiconductor device of the present embodiment. FIG. 6A is a plan view, and FIG. 6B is a cross-sectional view along line C-C' of FIG. 6A. Fundamental configuration of the semiconductor device of the present embodiment is similar to that of the semiconductor device 100 described in first embodiment (FIG. 1), except the following aspects.

In the present embodiment, an uppermost layer interconnect that faces one flip-chip pad 111 includes a first uppermost layer interconnect (uppermost layer interconnect 127) and a second uppermost layer interconnect (uppermost layer interconnect 129). The flip-chip pad 111 and the uppermost layer interconnect 127 constitute a first capacitor element, and the flip-chip pad 111 and the uppermost layer interconnect 129 constitutes the second capacitor element. The uppermost layer interconnect 127 and the uppermost layer interconnect 129 are, for example, coupled to different potentials. More specifically, the uppermost layer interconnect 127 and the uppermost layer interconnect 129 are coupled to power supply potentials of different potentials, respectively.

The semiconductor device shown in FIG. 6A and FIG. 6B are obtained by, for example, conducting the following procedure.

First of all, an interlayer film 103 is formed on a silicon substrate 101 having a semiconductor element/interconnect or a circuit formed therein. Then, the uppermost layer interconnect 127 coupled to a first power supply potential and the uppermost layer interconnect 129 coupled to a second power supply potential that is different from first power supply potential are formed in the same process in the process for forming the uppermost layer interconnect to be in coplanar relationship.

Next, the cover film 107 is formed on the interlayer film 103. Then, the opening region 115 is formed so as to extend over a region above the uppermost layer interconnect 127 and a region above the uppermost layer interconnect 129 to form the capacitive film 109. Thereafter, the flip-chip pad 111 is formed on the capacitive film 109. This provides the flip-chip pad 111 formed to extend from the region above the uppermost layer interconnect 127 to the region above the uppermost layer interconnect 129. Available process for forming respective layers and the configurations thereof may include the process and the configuration described in first embodiment.

In the present embodiment, capacitor elements, which commonly have an upper electrode of the flip-chip pad 111, can be simultaneously formed on a plurality of power supply interconnects having different potentials provided under the flip-chip pad 111. In addition, this provides a further improved design flexibility for the region under the flip-chip pad 111.

In the technology described in Japanese Patent Laid-Open No. 2001-313,372 described above in the description of the related art, a configuration is illustrated that a lower plate is divided into two pieces among interconnects constituting a capacitance. On the contrary, the present embodiment is different from such conventional configuration, in view of an aspect that the upper electrode that constitutes a capacitance, or namely the flip-chip pad 111, exhibits a pad function. Further, in the present embodiment, number of the interconnects extending under the flip-chip pad 111 is not limited to two, and three or more interconnects may also be employed, and the potential may be freely selected, and even disposing a signal line is possible. Further, as discussed later in a description of ninth embodiment, a capacitance may be added to only a specified uppermost layer interconnect among a plurality of uppermost layer interconnects, and only a specified interconnect may also be coupled to the flip-chip pad 111.

Seventh Embodiment

The configurations of sixth embodiment may alternatively be configured that the flip-chip pad 111 is coupled to a third power supply potential that is different from the uppermost layer interconnect 127 and the uppermost layer interconnect 129 in a side of the substrate. The third power supply potential may be selected to be, for example, a ground potential (GND).

Figure 7A:
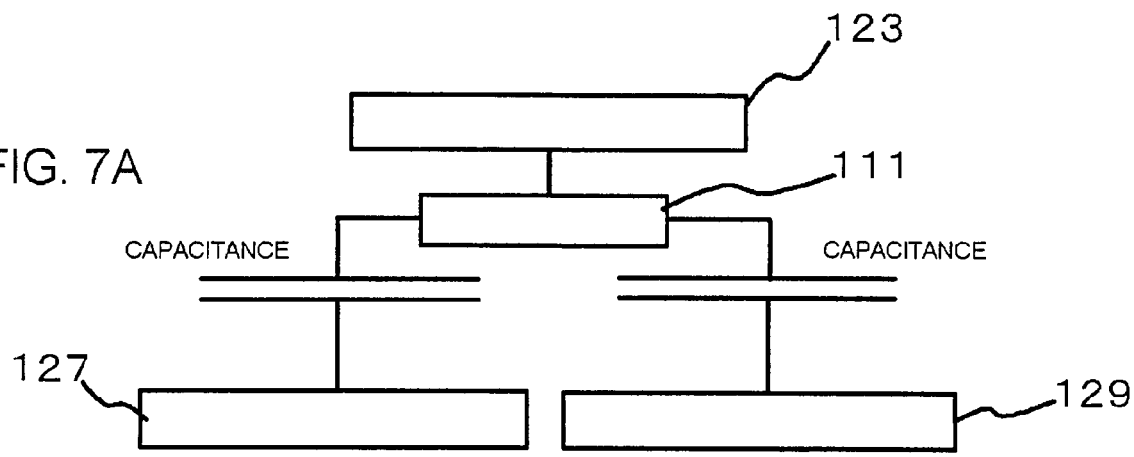
FIGS. 7A and 7B are diagrams, illustrating a configuration of a semiconductor device in an embodiment.
Figure 7B:
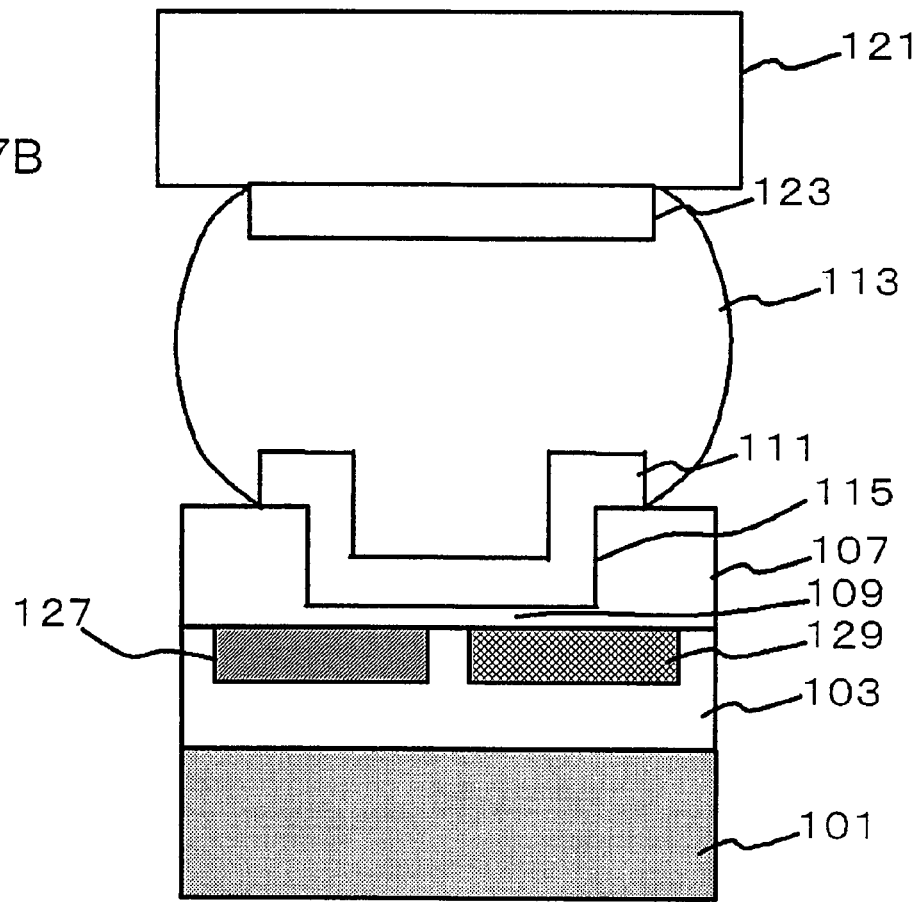

FIG. 7A and FIG. 7B are cross-sectional views, illustrating a configuration of a semiconductor device of the present embodiment.

The semiconductor device is formed according to the following procedure. The procedure from forming the silicon substrate 101 to forming the flip-chip pad 111 is similar to that in sixth embodiment. Then, the solder ball 113 is formed on the flip-chip pad 111, and the pad 123 in the side of the substrate 121 is coupled to the solder ball 113.

In addition to above, the pad 123 in the side of the substrate is coupled to a third power supply potential that is different from both a first power supply potential of the uppermost layer interconnect 127 and a second power supply potential of the uppermost layer interconnect 129, or namely a ground potential, for example.

According to the present embodiment, as schematically shown in FIG. 7A, capacitances can be simultaneously formed through the flip-chip pad 111 among three different potentials, or namely for example, between ground-first power supply potential and between ground-second power supply potential. Further, in the present embodiment, further improved design flexibility for the region under the flip-chip pad 111 can be provided.

Eighth Embodiment

The configurations of the sixth embodiment may alternatively be configured that the flip-chip pad 111 is opened (OPEN), or more specifically, the flip-chip pad 111 is not coupled to the pad 123 in the side of the substrate 121.

Figure 8A:
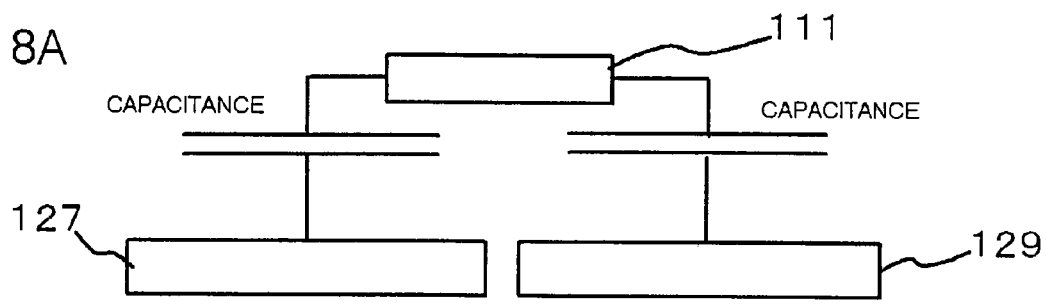
FIGS. 8A and 8B are diagrams, illustrating a configuration of a semiconductor device in an embodiment.
Figure 8B:
Figure 8B:
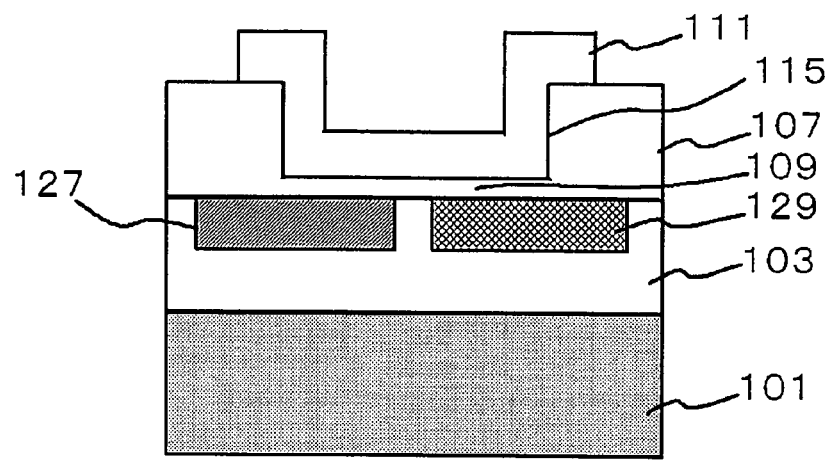

FIG. 8A and FIG. 8B are cross-sectional views, illustrating a configuration of a semiconductor device of the present embodiment. Although it is not shown in these diagrams, the semiconductor device of the present embodiment may include a flip-chip pad for creating a flip-connection (for example, flip-chip pad 131 of FIG. 16) in the same layer containing the flip-chip pad 111.

In manufacturing process illustrated in FIG. 8A and FIG. 8B, a procedure from forming the silicon substrate 101 until forming the flip-chip pad 111 is similar to that in sixth embodiment.

Next, while a solder ball is formed on the flip-chip pad (not shown) for providing an ordinary coupling, which is formed in the same layer that also includes the flip-chip pad 111, no solder ball is formed on the flip-chip pad 111.

Then, the flip-chip pad for creating flip-connection is coupled to the pad 123 in the side of the substrate 121. This provides the configuration that no solder ball is present on the flip-chip pad 111 as shown in FIG. 8B, and thus the flip-chip pad 111 is in a condition of being electrically opened.

In the present embodiment, as schematically shown in FIG. 8A, through the flip-chip pad 111, a capacitance is formed between the uppermost layer interconnect 127 and the uppermost layer interconnect 129 and a capacitance is formed between the first power supply potential—the second power supply potential. Further, in the present embodiment, further improved design flexibility for the region under the flip-chip pad 111 can be provided.

Ninth Embodiment

The present embodiment is related to a configuration, in which a plurality of uppermost layer interconnects are present under the flip-chip pad 111 of the second embodiment, and an interconnect coupling to the flip-chip pad 111 and an interconnect constituting a capacitance are provided. The uppermost layer interconnects under the flip-chip pad 111 are a plurality of power supply interconnects of different potentials, signal interconnects, or a combination thereof, and a capacitance is selectively formed and coupled to any of these interconnects.

Figure 9A:
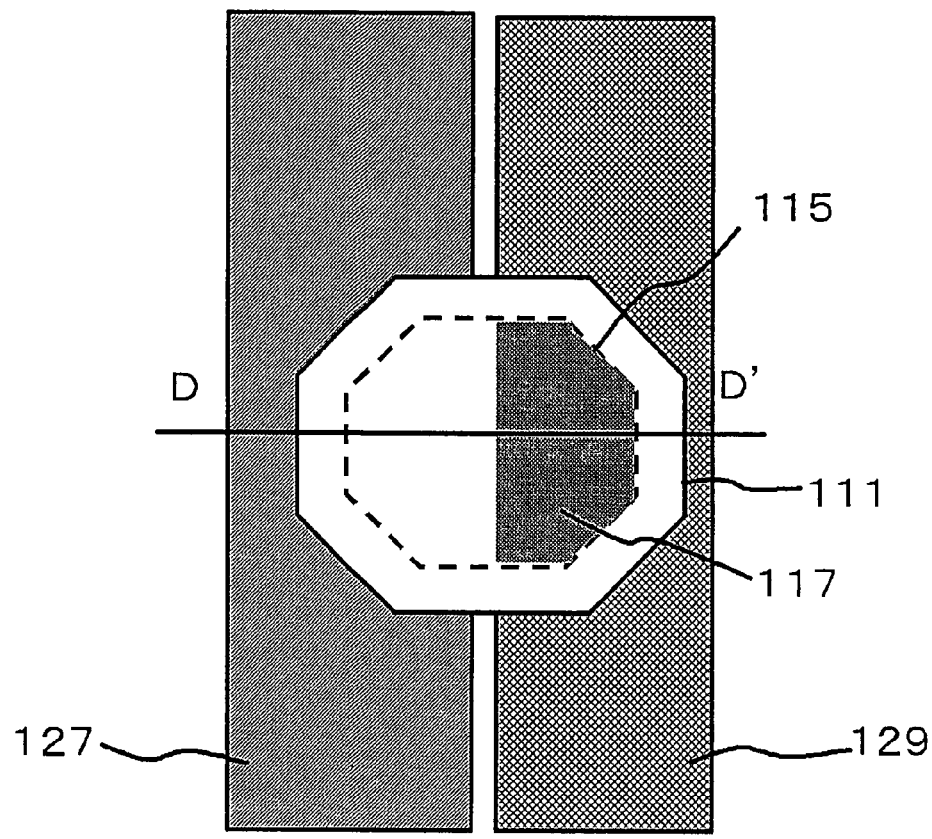
FIGS. 9A and 9B are diagrams, illustrating a configuration of a semiconductor device in an embodiment.
Figure 9B:
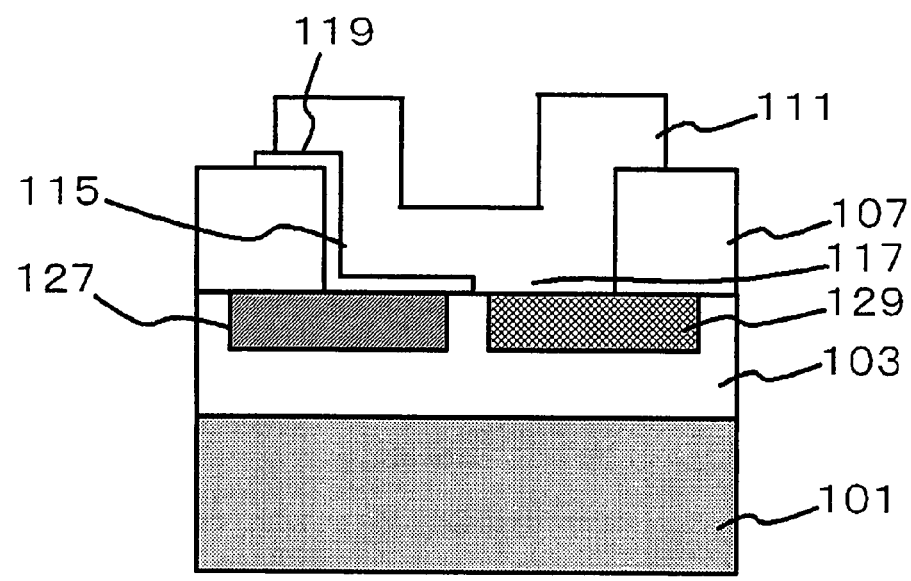

FIG. 9A and FIG. 9B are diagrams, illustrating a configuration of a semiconductor device of the present embodiment. FIG. 9A is a plan view, and FIG. 9B is a cross-sectional view along line D-D' of FIG. 9A.

In a semiconductor device shown in FIG. 9A and FIG. 9B, an uppermost layer interconnect that faces one flip-chip pad 111 includes a first uppermost layer interconnect (uppermost layer interconnect 127) and a second uppermost layer interconnect (uppermost layer interconnect 129).

The flip-chip pad 111 is directly coupled to the uppermost layer interconnect 129 in a partial region of a bottom surface, and a capacitive film 119 is disposed between the flip-chip pad 111 and the uppermost layer interconnect 127 in other region thereof. The region including the capacitive film 119 disposed therebetween serves as a capacitor element, and a junction region between the uppermost layer interconnect 129 and the flip-chip pad 111 functions as an electrical coupling region between the interconnect and the substrate 121 (not shown). More specifically, the flip-chip pad 111 and the uppermost layer interconnect 127 constitute a capacitor element, and the flip-chip pad 111 is electrically coupled to the uppermost layer interconnect 129.

The semiconductor device is formed according to the following procedure. The procedure until the uppermost layer interconnect 127 and the uppermost layer interconnect 129 are formed on the silicon substrate 101 is similar to that in sixth embodiment. Next, the cover film 107 is formed.

Then, in a region extending across the uppermost layer interconnect 127 and the uppermost layer interconnect 129, a portion of the cover film 107 is selectively removed to form a concave portion, thereby exposing surfaces of the uppermost layer interconnect 127 and the uppermost layer interconnect 129.

Subsequently, a high dielectric constant film is formed on the entire upper surface of the cover film 107. The high dielectric constant film is patterned, so that, concerning the above of the exposed portion of the uppermost layer interconnect 127, the capacitive film 119 covers the uppermost layer interconnect 127 to constitute an upper surface of the opening region 115, and a processing is conducted to remove the capacitive film 119 from the exposed portion of the uppermost layer interconnect 129 or namely from the region above the pad via 117 to form the capacitive film 119.

Then, the flip-chip pad 111 is formed on the capacitive film 119 and the opening region 115. Available process for forming respective layers and the configurations thereof may include that described in second embodiment.

In the present embodiment, the flip-chip pad 111 is electrically coupled to the uppermost layer interconnect 129, and, a capacitor element is formed between the flip-chip pad 111 and the uppermost layer interconnect 127. Thus, according to the present embodiment, a single flip-chip pad 111 can simultaneously achieve creating a coupling with the substrate 121 (not shown) and forming a capacitor element.

While the exemplary implementation of the structure in second embodiment is illustrated in the present embodiment, it should be noted that the capacitive film may alternatively be formed with the cover film 107, similarly as a first embodiment. In this case, the thickness of the cover film 107 is partially reduced in the region thereof above the uppermost layer interconnect 127, and the cover film 107 is removed to expose the uppermost layer interconnect 129 in the region thereof above the uppermost layer interconnect 129.

Alternatively, similarly as in seventh and eighth embodiments, a coupling with the packaged substrate or package substrate may also be created.

Tenth Embodiment

In the above embodiments, the descriptions are mainly focused on the cases, where the geometry of the flip-chip pad 111 constituting the capacitor element is the same as the geometry of a flip-chip pad for creating an ordinary coupling (for example, flip-chip pad 131 of FIG. 16). Since the flip-chip pads are ordinarily arranged according to a predetermined arrangement rule such as a grid-pattern, an array pattern at regular intervals and the like, the above-described configuration is made, in consideration of the arrangement of the flip-chip pad ill constituting the capacitor element in a space having no flip-chip pad for creating an ordinary coupling along the arrangement rules.

However, available geometry for the flip-chip pad 111 is not particularly limited, and can be freely designed according to two-dimensional geometry such as a width and the like of the uppermost layer interconnect. In the present embodiment, another two-dimensional geometry of the flip-chip pad 111 will be described.

Following descriptions will be made, in which the configurations of ninth embodiment may alternatively be configured to, for example, be suitable for being employed in order to increase a capacitance (that is, area) per flip-chip pad.

Figure 10A:
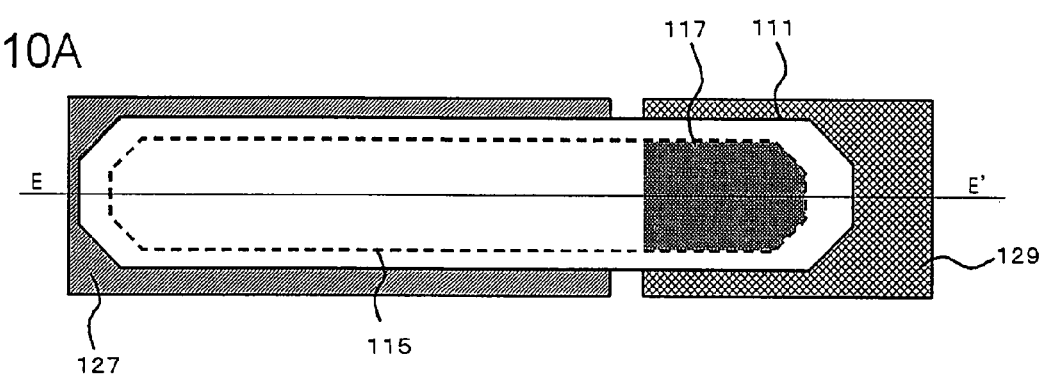
FIGS. 10A and 10B are diagrams, illustrating a configuration of a semiconductor device in an embodiment.
Figure 10B:
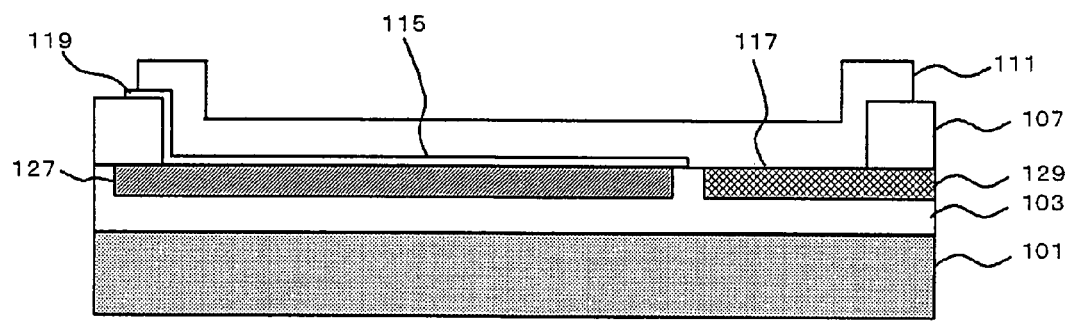

FIG. 10A and FIG. 10B are diagrams, illustrating a configuration of a semiconductor device of the present embodiment. FIG. 10A is a plan view, and FIG. 10B is a cross-sectional view along line E-E' of FIG. 10A. Fundamental configurations of a semiconductor device shown with FIG. 10A and FIG. 10B and a basic process for manufacturing thereof are similar to that in ninth embodiment.

However, in the present embodiment, a through hole provided in the flip-chip pad 111 and the cover film 107 is designed to be a predetermined form, and a larger opening is provided in the cover film 107 in the portion serving as the capacitance. Then, the capacitive film 119 and the flip-chip pad 111 are formed in a predetermined region on a bottom surface of the pad via 117, similarly as in ninth embodiment.

Uniform geometry and height of the solder ball are preferably required for providing an improved connectivity with the packaged substrate or package substrate, and these are determined by a geometry of the flip-chip pad and a quantity of solder. Thus, in the configurations in first to ninth embodiments, uniform geometry and height of the solder ball can be provided, by selecting the geometry of the flip-chip pad 111 as the geometry same as that of the flip-chip pad for creating the ordinary coupling (for example, flip-chip pad 131 of FIG. 16), concerning the flip-chip pad 111 that possibly forms a solder ball. However, when flip-chip pad 111 is not coupled to the pad in the side of the substrate, the geometry of the flip-chip pad 111 constituting the capacitor element can be freely designed likely as in the present embodiment, within a range of the scope of the invention that does not provide an influence to the peripheral flip-chip pad. This configuration provides an increased area of the capacitance per a capacitor element, and thus an increase in the capacitance is facilitated.

While the exemplary implementation of the structure in second embodiment is illustrated in the present embodiment, it should be noted that the capacitive film may alternatively be formed with the cover film similarly as a first embodiment, or a structure of eighth embodiment may be employed.

While the preferred embodiments of the present invention have been described above in reference to the annexed figures, it should be understood that the disclosures above are presented for the purpose of illustrating the present invention, and various configurations other than the above described configurations can also be adopted.

For example, the configurations including one or more uppermost layer interconnect provided so as to face the lower portion of the flip-chip pad 111 are illustrated in the above-mentioned embodiments, and in contradiction thereto, a plurality of flip-chip pads 111 constituting a capacitor element may be provided so as to face the upper portion of one uppermost layer interconnect. Alternatively, in such case, a plurality of flip-chip pads 111 may also be coupled to different potentials, respectively.

It is apparent that the present invention is not limited to the above embodiment, and may be modified and changed without departing from the scope and spirit of the invention.

What is claimed is:

1. A semiconductor device, comprising:
a semiconductor substrate;
an insulating interlayer on said semiconductor substrate;
a multiple-layered interconnect embedded in said insulating interlayer;
an electrode pad provided so as to be opposite an upper surface of an uppermost layer of said multiple-layered interconnect, said electrode pad having a bump electrode for an external coupling mounted thereon; and
a first insulating film interposed between said uppermost layer of said multiple-layered interconnect and said electrode pad, said first insulating film consisting of a single material contacting an entirety of an uppermost surface of said uppermost layer of said multiple-layered interconnect, said first insulating film covering an upper portion of said insulating interlayer and having a concave portion provided in a region opposite said uppermost surface of said uppermost layer of said multiple-layered interconnect, thereby forming a capacitor element with said uppermost layer of said multiple-layered interconnect and said electrode pad,
wherein a thickness of said first insulating film is reduced in the region where said concave portion is formed, and a capacitance is formed in the region of said first insulating film having the reduced thickness.

2. The semiconductor device according to claim 1, wherein said electrode pad is provided so as to cover an interior wall of said concave portion and to extend to outside of said concave portion.

3. The semiconductor device according to claim 1, wherein said multiple-layered interconnect comprises a first layer selected from the group consisting of Al, Cu and an alloy thereof and a second layer selected from the group consisting of Ti, TiN, TiW, Ta and TaN.

4. The semiconductor device according to claim 1, wherein said uppermost surface of said uppermost layer of said multiple-layered interconnect is substantially coplanar with an uppermost surface of said insulating interlayer.

5. The semiconductor device according to claim 1, wherein said bump electrode is arranged to overlap said electrode pad so that said electrode pad is behind said bump electrode in plan view of the device.

6. The semiconductor device according to claim 1, wherein said bump electrode is arranged to overlap a region of said capacitor element so that said capacitor element is behind said bump electrode in plan view of the device.

7. The semiconductor device according to claim 1, wherein said uppermost layer of said multiple-layered interconnect is embedded in a second concave portion provided in said insulating interlayer, and said first insulating film covers on a boundary between said uppermost layer of said multiple-layered interconnect and said insulating interlayer in plan view, thereby is stacked on said uppermost layer of said multiple-layered interconnect and said insulating interlayer.

8. The semiconductor device according to claim 7, wherein said uppermost layer of said multiple-layered interconnect is formed so as to fill an upper portion of said second concave portion provided in said insulating interlayer.

* * * * *